United States Patent
Ito et al.

(10) Patent No.: US 12,520,463 B2
(45) Date of Patent: Jan. 6, 2026

(54) ELECTROMAGNETIC SHIELDING LAMINATED SHEET

(71) Applicants: Panasonic Holdings Corporation, Osaka (JP); National University Corporation Tokai National Higher Education and Research System, Aichi (JP); Zeon Corporation, Tokyo (JP); National University Corporation Yamagata University, Yamagata (JP)

(72) Inventors: Akira Ito, Osaka (JP); Tomonaga Ueno, Aichi (JP); Kishio Hidaka, Yamagata (JP); Mitsuo Ueno, Tokyo (JP); Atsushi Sakai, Tokyo (JP)

(73) Assignees: Panasonic Holdings Corporation, Osaka (JP); National University Corporation Tokai National Higher Education and Research System, Aichi (JP); Zeon Corporation, Tokyo (JP); National University Corporation Yamagata University, Yamagata (JP)

( * ) Notice: Subject to any disclaimer, the term of this patent is extended or adjusted under 35 U.S.C. 154(b) by 152 days.

(21) Appl. No.: 17/982,948

(22) Filed: Nov. 8, 2022

(65) Prior Publication Data
US 2023/0070071 A1   Mar. 9, 2023

Related U.S. Application Data

(63) Continuation of application No. PCT/JP2021/017431, filed on May 7, 2021.

(30) Foreign Application Priority Data

May 11, 2020 (JP) .................. 2020-083342

(51) Int. Cl.
*H05K 9/00* (2006.01)
*C08K 3/04* (2006.01)
(Continued)

(52) U.S. Cl.
CPC ............. *H05K 9/009* (2013.01); *C08K 3/041* (2017.05); *C08L 1/10* (2013.01); *C08L 63/00* (2013.01)

(58) Field of Classification Search
CPC .................................. H01B 11/06; H05K 9/00
See application file for complete search history.

(56) References Cited

U.S. PATENT DOCUMENTS 9,055,667 B2 * 6/2015 Doneker ............. H05K 9/0015
10,626,252 B2 4/2020 Choi et al.
(Continued)

FOREIGN PATENT DOCUMENTS

CN   103923337 A   7/2014
CN   104860293 A   8/2015
(Continued)

OTHER PUBLICATIONS

Extended European Search Report dated Sep. 28, 2023 issued in the corresponding European Patent Application No. 21803166.4.
(Continued)

*Primary Examiner* — Chau N Nguyen
(74) *Attorney, Agent, or Firm* — Rimon P.C.

(57) ABSTRACT

An electromagnetic shielding laminated sheet includes: an electromagnetic wave absorbing layer which includes a matrix and carbon nanotubes dispersed in the matrix and which has a bulk density equal to or less than 997 kg/m$^3$; and a metal layer laid on top of the electromagnetic wave absorbing layer.

9 Claims, 2 Drawing Sheets

(51) Int. Cl.
*C08L 1/10* (2006.01)
*C08L 63/00* (2006.01)
*H01B 11/06* (2006.01)

(56) References Cited

U.S. PATENT DOCUMENTS

| | | | | |
|---|---|---|---|---|
| 2003/0213939 | A1* | 11/2003 | Narayan | H01B 1/24 252/500 |
| 2007/0254971 | A1* | 11/2007 | De Vogel | B29C 70/66 521/59 |
| 2010/0209755 | A1* | 8/2010 | Hirose | H02S 40/42 429/120 |
| 2012/0247800 | A1* | 10/2012 | Shah | H01B 1/24 977/734 |
| 2016/0064746 | A1* | 3/2016 | Iino | H01M 8/0213 429/510 |
| 2018/0201770 | A1* | 7/2018 | Hamabe | C08J 5/045 |
| 2018/0346679 | A1 | 12/2018 | Shishkin et al. | |
| 2023/0105161 | A1* | 4/2023 | Komiyama | C01B 32/174 252/478 |

FOREIGN PATENT DOCUMENTS

| | | | |
|---|---|---|---|
| CN | 105283056 | A | 1/2016 |
| CN | 107254068 | A | 10/2017 |
| CN | 108394148 | A | 8/2018 |
| CN | 108640566 | A | 10/2018 |
| CN | 109456031 | A | 3/2019 |
| JP | 2006-240295 | * | 9/2006 |
| JP | 2014-062515 | * | 4/2014 |
| JP | 2015-227411 | A | 12/2015 |
| JP | 2019-102665 | A | 6/2019 |
| WO | 2011/111499 | A1 | 9/2011 |

OTHER PUBLICATIONS

International Search Report dated Jul. 27, 2021 issued in International Patent Application No. PCT/JP2021/017431, with English translation.

The Second Office Action issued for the corresponding Chinese Patent Application No. 202180034216.8, dated Aug. 29, 2025.

* cited by examiner

ELECTROMAGNETIC SHIELDING LAMINATED SHEET

CROSS-REFERENCE TO RELATED APPLICATIONS

The present application is a Bypass Continuation of International Application No. PCT/JP2021/017431 filed on May 7, 2021, which is based upon and claims the benefit of priority to Japanese Patent Application No. 2020-083342, filed on May 11, 2020, the entire contents of both applications are incorporated herein by reference.

TECHNICAL FIELD

The present disclosure generally relates to an electromagnetic shielding laminated sheet, and more particularly relates to an electromagnetic shielding laminated sheet which may be used advantageously as a shield against electromagnetic waves.

BACKGROUND ART

JP 2019-102665 A discloses an electromagnetic wave absorber, which includes: a first layer made of a dielectric material; a second layer having electrical conductivity; a third layer made of a dielectric material; and a fourth layer having electrical conductivity. The electromagnetic wave absorber has a multilayer structure in which the first, second, third, and fourth layers are stacked one on top of another in this order. The second layer has a sheet resistance equal to or greater than 100 Ω/sq. and equal to or less than 300 Ω/sq. and the fourth layer is an electromagnetic wave reflector.

SUMMARY

The problem to be overcome by the present disclosure is to provide an electromagnetic shielding laminated sheet with the ability to reduce transmission and reflection of electromagnetic waves irrespective of its light weight.

An electromagnetic shielding laminated sheet according to an aspect of the present disclosure includes: an electromagnetic wave absorbing layer which includes a matrix and carbon nanotubes dispersed in the matrix and which has a bulk density equal to or less than 997 kg/m$^3$; and a metal layer laid on top of the electromagnetic wave absorbing layer.

BRIEF DESCRIPTION OF THE DRAWINGS

The figures depict one or more implementation in accordance with the present teaching, by way of example only, not by way of limitations. In the figures, like reference numerals refer to the same or similar elements.

DETAILED DESCRIPTION

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

First, it will be described generally how the present inventors conceived the concept of the present disclosure.

In information and communications using electronic equipment, reducing the weight of a carrier, for example, to be equipped with electronic equipment for use in the fields of aviation, space exploitation, and on the ground is a task that must be accomplished from the viewpoint of cutting down the fuel consumption.

In such applications, it is important to create a shield against electromagnetic waves generated by the electronic equipment in order to prevent the electronic equipment from malfunctioning due to the noise and to control the path of electromagnetic waves being used to establish communication between a plurality of electronic devices. In some cases, not only transmission of the electromagnetic waves but also reflection of the electromagnetic waves need to be reduced.

However, no practical material with the ability to significantly reduce both transmission and reflection of electromagnetic waves irrespective of its light weight has been provided so far.

Thus, to overcome such a problem, the present inventors carried out extensive research and development to provide an electromagnetic shielding laminated sheet with the ability to reduce both transmission and reflection of electromagnetic waves irrespective of its light weight, thus conceiving the concept of the present disclosure.

Next, an exemplary embodiment of the present disclosure will be described. Note that the embodiment to be described below is only an exemplary one of various embodiments of the present disclosure and should not be construed as limiting. Rather, the exemplary embodiment may be readily modified in various manners depending on a design choice or any other factor without departing from the scope of the present disclosure.

Figure 1:
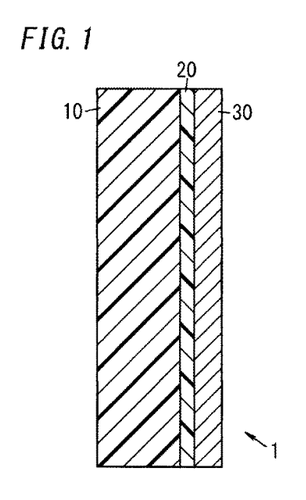
FIG. 1 is a schematic cross-sectional view of an electromagnetic shielding laminated sheet according to an exemplary embodiment of the present disclosure.

An electromagnetic shielding laminated sheet 1 according to an exemplary embodiment includes a plurality of layers which are stacked one on top of another. The plurality of layers includes at least an electromagnetic wave absorbing layer 10 and a metal layer 30. In other words, the electromagnetic shielding laminated sheet 1 includes the electromagnetic wave absorbing layer 10 and the metal layer 30 laid on top of the electromagnetic wave absorbing layer 10. The electromagnetic wave absorbing layer 10 includes a matrix and carbon nanotubes dispersed in the matrix and has a bulk density equal to or less than 997 kg/m$^3$.

According to this embodiment, the electromagnetic wave absorbing layer 10 has a bulk density equal to or less than 997 kg/m$^3$, thus enabling reducing the weight of the electromagnetic shielding laminated sheet 1. In addition, if an electromagnetic wave, traveling in the direction from the electromagnetic wave absorbing layer 10 toward the metal layer 30, has been incident on the electromagnetic shielding laminated sheet 1, the electromagnetic wave is blocked by the metal layer 30, and therefore, is hardly transmitted through the electromagnetic shielding laminated sheet 1. Furthermore, the electromagnetic wave reflected from the metal layer 30 is likely to be reflected multiple times between the metal layer 30 and the electromagnetic wave absorbing layer 10 inside the electromagnetic shielding laminated sheet 1, and therefore, tends to attenuate significantly. This reduces the chances of the electromagnetic wave being reflected from the electromagnetic shielding laminated sheet 1.

Thus, this embodiment enables providing an electromagnetic shielding laminated sheet 1 with the ability to reduce transmission and reflection of electromagnetic waves irrespective of its light weight.

Next, the configuration of the electromagnetic shielding laminated sheet 1 will be described in further detail.

The electromagnetic shielding laminated sheet 1 includes a plurality of layers, which are stacked one on top of another as described above and which includes at least the electromagnetic wave absorbing layer 10 and the metal layer 30. Optionally, the plurality of layers may consist of the electromagnetic wave absorbing layer 10 and the metal layer 30. In that case, the electromagnetic wave absorbing layer 10 and the metal layer 30 may be stacked one on top of the other directly in contact with each other. Alternatively, the plurality of layers may further include an insulating layer 20, for example. In that case, the insulating layer 20 may be interposed between the electromagnetic wave absorbing layer 10 and the metal layer 30. That is to say, the electromagnetic wave absorbing layer 10, the insulating layer 20, and the metal layer 30 may be stacked one on top of another in this order.

The metal layer 30 may be a metallic sheet, for example. The material for the metal layer 30 may be, but does not have to be, aluminum or copper, for example. The metal layer 30 may be a thin film formed by evaporation process, for example, or a metallic constructional material, whichever is appropriate.

The thickness of the metal layer 30 is adjusted as appropriate to achieve sufficient shielding capability against electromagnetic waves and may be, for example, equal to or greater than 1 nm. Also, the thickness of the metal layer 30 is, for example, equal to or less than 100 mm but may also be greater than 100 mm.

The electromagnetic wave absorbing layer 10 has a bulk density equal to or less than 997 kg/m$^3$ as described above, which may reduce the weight of the electromagnetic shielding laminated sheet 1. In addition, as described above, the electromagnetic wave absorbing layer 10 includes a matrix and carbon nanotubes dispersed in the matrix, thus causing the electromagnetic waves to be reflected multiple times between the metal layer 30 and the electromagnetic wave absorbing layer 10 and thereby attenuating the electromagnetic waves. Note that the "matrix" as used herein refers to a matrix in the field of composite materials. Causing the carbon nanotubes to be dispersed in the matrix allows the matrix and the carbon nanotubes to be composited with each other.

The electromagnetic wave absorbing layer 10 preferably has a porous structure. This increases the chances of the electromagnetic wave absorbing layer 10 having a bulk density equal to or less than 997 kg/m$^3$. As used herein, the "porous structure" refers to a structure having internal voids. Examples of the porous structure include a structure in which voids that are elongate along the thickness of the electromagnetic wave absorbing layer 10 are arranged in a honeycomb pattern. In that case, the electromagnetic wave absorbing layer 10 has a porous structure but is less likely to be damaged even when subjected to a load in the thickness direction. Note that this is only an exemplary porous structure of the electromagnetic wave absorbing layer 10 and should not be construed as limiting.

The matrix of the electromagnetic wave absorbing layer 10 preferably contains a water-soluble polymer. This makes it easier to reduce the weight of the electromagnetic wave absorbing layer 10 by forming the electromagnetic wave absorbing layer 10 by freeze-drying method as will be described later and provide an electromagnetic wave absorbing layer 10 with a bulk density equal to or less than 997 kg/m$^3$. The bulk density of the electromagnetic wave absorbing layer 10 is more preferably equal to or less than 500 kg/m$^3$ and even more preferably equal to or less than 100 kg/m$^3$.

The solubility of the water-soluble polymer in water at 25° C. is preferably equal to or greater than 1 mg/1 g–H$_2$O. The water-soluble polymer may be any of a natural polymer, a semi-synthetic polymer, or a synthetic polymer. The water-soluble polymer includes at least one selected from the group consisting of, for example, guar gum, carrageenan, sodium alginate, corn starch, xanthan gum, sodium chondroitin sulfate, sodium hyaluronate, carboxymethyl cellulose, sodium carboxymethyl cellulose, methyl cellulose, hydroxyethyl cellulose, hydroxypropyl methyl cellulose, cationized guar gum, carboxyvinyl polymer, polyacrylic acid, polyvinylpyrrolidone, and polyvinyl alcohol. It is preferable that the water-soluble polymer contain at least one of carboxymethyl cellulose and hydroxypropyl methyl cellulose.

It is preferable that the matrix further contain a cured product of a thermosetting resin. This reduces, when the electromagnetic wave absorbing layer 10 is exposed to water, the chances of the water-soluble polymer being eluted. The thermosetting resin preferably has the property of forming an aqueous emulsion when dispersed in water. This makes it easier, when the electromagnetic wave absorbing layer 10 is formed by freeze-drying method, to disperse the thermosetting resin in the matrix of the electromagnetic wave absorbing layer 10 and further reduce the chances of the water-soluble polymer in the matrix being eluted into water.

The thermosetting resin preferably contains an epoxy resin. If the thermosetting resin contains an epoxy resin, then the thermosetting resin preferably further contains an epoxy resin curing agent as needed. This further reduces, when the electromagnetic wave absorbing layer 10 is exposed to water, the chances of the water-soluble polymer in the matrix being eluted into water. Either the epoxy resin or the epoxy resin and the curing agent preferably has the property of forming an aqueous emulsion when dispersed in water. This makes it easier, when the electromagnetic wave absorbing layer 10 is formed by freeze-drying method, to disperse the epoxy resin in the matrix of the electromagnetic wave absorbing layer 10 and further reduce the chances of the water-soluble polymer in the matrix being eluted into water.

The compound contained in the epoxy resin may be selected appropriately according to the method of making the electromagnetic wave absorbing layer 10. For example, the epoxy resin may include an emulsion type epoxy resin called an "aqueous epoxy resin" or an epoxy resin soluble in an organic solvent.

The emulsion type epoxy resin preferably includes at least one epoxy resin selected from the group consisting of bisphenol A epoxy resins and bisphenol F epoxy resins.

The epoxy resin soluble in an organic solvent preferably includes an epoxy resin for use in laminates. Specifically, the epoxy resin soluble in an organic solvent preferably includes at least one epoxy resin selected from the group consisting of, for example, bisphenol A epoxy resins, bisphenol F epoxy resins, brominated bisphenol A epoxy resins, naphthalene epoxy resins, biphenyl epoxy resins, and cresol-novolac epoxy resins.

The curing agent may be a general curing agent for use to cure epoxy resins. The curing agent includes at least one selected from the group consisting of, for example, phenol-based curing agents, amine-based curing agents, and acid anhydride-based curing agents.

The proportion of the thermosetting resin to the electromagnetic wave absorbing layer 10 is preferably equal to or greater than 5% by mass and equal to or less than 90% by mass. Also, if the thermosetting resin contains either an epoxy resin or an epoxy resin and a curing agent, then the proportion of the epoxy resin or the epoxy resin and the curing agent to the electromagnetic wave absorbing layer 10 is preferably equal to or greater than 5% by mass and equal to or less than 90% by mass. Making these proportions equal to or greater than 5% by mass further reduces the chances of the water-soluble polymer in the matrix being eluted into the water. Making these proportions equal to or less than 90% by mass reduces the chances of the thermosetting resin inhibiting the weight reduction of the electromagnetic wave absorbing layer 10.

Next, the carbon nanotubes in the electromagnetic wave absorbing layer 10 will be described.

Having the electromagnetic wave absorbing layer 10 contain the carbon nanotubes enables sufficiently attenuating electromagnetic waves in the electromagnetic shielding laminated sheet 1, and efficiently attenuating electromagnetic waves falling within the milli-wave band and the microwave band, in particular.

The carbon nanotubes (hereinafter abbreviated as "CNTs") include, for example, single-layer carbon nanotubes and/or multilayer carbon nanotubes.

A G/D ratio in the Raman spectrum of CNTs is an index which is generally used to evaluate the quality of CNTs. In the Raman spectrum of CNTs measured by a Raman spectrometer, vibration modes called a "G band" (in the vicinity of $1600\ cm^{-1}$) and a "D band" (in the vicinity of $1350\ cm^{-1}$) are observed. The G band is a vibration mode derived from a hexagonal lattice structure of graphite which defines a circular cylindrical surface of the CNTs. On the other hand, the D band is a vibration mode derived from an amorphous portion thereof. Thus, the higher the peak intensity ratio (G/D ratio) of the G band to the D band is, the higher the crystallinity of the CNTs evaluated would be. The higher the G/D ratio is, the larger the percentage of electrically conductive graphite structure of the CNTs and the higher the electrical conductivity of the CNTs will be. This enables improving the electromagnetic wave absorption capability of the electromagnetic shielding laminated sheet 1 in a high-frequency region with the addition of a smaller amount of CNTs, which is advantageous in terms of cost. In addition, since a smaller amount of CNTs may be added, an electromagnetic shielding laminated sheet 1 with excellent moldability may also be obtained. The G/D ratio is preferably equal to or greater than three.

Also, the CNTs preferably form either a single layer or multiple (five or less) layers of carbon nanotubes. The CNTs more preferably form a single layer of carbon nanotubes. The CNTs implemented as a single-layer of carbon nanotubes would improve the electromagnetic wave absorption capability of the electromagnetic shielding laminated sheet 1 in a high-frequency region with a smaller amount of carbon nanotubes added than in multiple layers of carbon nanotubes.

The CNTs preferably have an average diameter (Av) equal to or greater than 0.5 nm, and more preferably have an average diameter (Av) equal to or greater than 1 nm. Meanwhile, the CNTs preferably have an average diameter (Av) equal to or less than 15 nm and more preferably have an average diameter (Av) equal to or less than 10 nm. Making the average diameter (Av) of the CNTs equal to or greater than 0.5 nm enables further improving the electromagnetic wave absorption capability of the electromagnetic shielding laminated sheet 1 in a high-frequency region. Also, making the average diameter (Av) of the CNTs equal to or less than 15 nm allows the electromagnetic shielding laminated sheet 1 to maintain the electromagnetic wave absorption capability even when the electromagnetic shielding laminated sheet 1 is flexed because the electromagnetic shielding laminated sheet 1 is flexible.

Note that the average diameter (Av) may be measured by observing CNTs through a transmission electron microscope. The average diameter (Av) may be adjusted by changing the manufacturing method or manufacturing condition of CNTs. Alternatively, the average diameter (Av) may also be adjusted by combining multiple different types of CNTs obtained by multiple different manufacturing methods.

The BET specific surface area of the CNTs is preferably equal to or greater than 600 $m^2$/g, and more preferably equal to or greater than 800 $m^2$/g. Meanwhile, the BET specific surface area thereof is preferably equal to or less than 2500 $m^2$/g and more preferably equal to or less than 1200 $m^2$/g. Making the BET specific surface area equal to or greater than 600 $m^2$/g enables further improving the electromagnetic wave absorption capability of the electromagnetic shielding laminated sheet 1 in a high-frequency region. Making the BET specific surface area equal to or less than 2500 $m^2$/g enables improving the moldability of the electromagnetic wave absorbing layer 10.

As used herein, the "BET specific surface area" refers to a specific surface area by nitrogen adsorption as measured by the BET method.

CNTs may be obtained, according to the super growth method (to be described later), for example, as an aggregate of CNTs which are aligned substantially perpendicularly to a base member, on the base member including, on its surface, a catalyst layer for growing carbon nanotubes. Such an aggregate of CNTs is sometimes called an "aggregate of aligned carbon nanotubes." In this case, the aggregate of aligned carbon nanotubes preferably has a mass density equal to or greater than 0.002 $g/cm^3$ and equal to or less than 0.2 $g/cm^3$. Making the mass density equal to or less than 0.2 $g/cm^3$ enables further improving the electromagnetic wave absorption capability of the electromagnetic shielding laminated sheet 1 in a high-frequency region by causing the CNTs to be dispersed homogeneously. In addition, making the mass density equal to or greater than 0.002 $g/cm^3$ also makes it easier to handle the electromagnetic shielding laminated sheet 1 because this may reduce the chances of the CNTs being scattered.

The t-plot of CNTs obtained from an adsorption isotherm preferably has a convex up shape. Among other things, the CNTs are more preferably not subjected to aperture processing and t-plot has a convex up shape. This enables further improving the electromagnetic wave absorption capability of the electromagnetic shielding laminated sheet 1 in a high-frequency region.

Note that the "t-plot" may be obtained by transforming a relative pressure measured by the nitrogen gas adsorption method into an average thickness "t" (nm) of a nitrogen gas adsorbing layer. That is to say, the "t-plot" may be obtained by finding an average thickness "t" of the nitrogen gas adsorbing layer, corresponding to the relative pressure, on a known standard isotherm, which plots the average thickness "t" of the nitrogen gas adsorbing layer with respect to the relative pressure P/P0, and by making the transformation described above (according to the t-plot method by de Boer et al.).

In this case, in a substance having micropores on its surface, the growth of the nitrogen gas adsorbing layer is classified into the following three processes (1)-(3). In addition, the gradient of the t-plot changes through the following three processes (1)-(3):

(1) process in which a single molecular adsorbing layer of a nitrogen molecule is formed on the entire surface;
(2) process in which a multi-molecular adsorbing layer is formed and capillaries are condensed and filled within micropores as a result; and
(3) process in which a multi-molecular adsorbing layer is formed on an apparent non-porous surface, of which the micropores are filled with nitrogen.

Also, in a region where the average thickness "t" of the nitrogen gas adsorbing layer is small, the t-plot having the convex up shape is located on a line that passes through the origin. On the other hand, as "t" increases, the plot shifts downward from the line. It can be seen that a structure having such a t-plot shape, the proportion of an internal specific surface area to the total specific surface area is so large that a great many apertures are formed through the CNTs.

Note that the inflection point of the t-plot of the CNTs preferably falls within a range where $0.2 \leq t$ (nm)$\leq 1.5$ is satisfied, more preferably falls within a range where $0.45 \leq t$ (nm)$\leq 1.5$ is satisfied, and even more preferably falls within a range where $0.55 \leq t$ (nm)$\leq 1.0$ is satisfied.

Note that the "inflection point" is located at an intersection between an approximation line A representing the process (1) and an approximation line B representing the process (3).

An S2/S1 ratio, which is the ratio of the internal specific surface area S2 to the total specific surface area S1 obtained from the t-plot, of CNTs is preferably equal to or greater than 0.05 and equal to or less than 0.30.

Also, the total specific surface area S1 and internal specific surface area S2 of the CNTs are not limited to any particular values. For example, S1 is preferably equal to or greater than 600 $m^2/g$ and equal to or less than 1400 $m^2/g$, and more preferably equal to or greater than 800 $m^2/g$ and equal to or less than 1200 $m^2/g$. On the other hand, S2 is preferably equal to or greater than 30 $m^2/g$ and equal to or less than 540 $m^2/g$.

In this case, the total specific surface area S1 and internal specific surface area S2 of the CNTs may be obtained based on the t-plot of the CNTs. Specifically, the total specific surface area S1 may be obtained based on the gradient of the approximation line representing the process (1) and an external specific surface area S3 may be obtained based on the gradient of the approximation line representing the process (3). Then, the internal specific surface area S2 may be calculated by subtracting the external specific surface area S3 from the total specific surface area S1.

Note that measurement of the adsorption isotherm of CNTs, making the t-plot, and calculation of the total specific surface area S1 and internal specific surface area S2 based on the analysis of the t-plot may be carried out using, for example, a commercially available measuring device BELSORP®-mini (manufactured by MicrotracBEL Corporation (formerly, BEL Japan, Inc.)).

CNTs having such properties may be manufactured efficiently by the super-growth method (see WO 2006/011655 A1) in which when CNTs are synthesized by chemical vapor deposition (CVD) process with a source compound and a carrier gas supplied onto a base member having, on its surface, a catalyst layer for manufacturing carbon nanotubes, the catalyst activity of the catalyst layer is significantly increased by making a very small amount of oxidant (as a catalyst activating substance) present in the system. The catalyst layer is preferably formed on the surface of the base member by a wet process. The carbon nanotubes obtained by the super-growth method will be hereinafter referred to as "SG CNTs."

Note that the CNTs manufactured by the super-growth method may either consist of only SG CNTs or include SG CNTs and carbon nanostructures having a non-cylindrical shape. Specifically, CNTs may include single-layer or multilayer compressed cylindrical carbon nanostructures having, along its entire length, a tape-shaped portion in which their inner walls are either provided close to each other or bonded together (hereinafter referred to as a "graphene nanotape (GNT)."

As used herein, "having a tape-shaped portion along its entire length" means "having a tape-shaped portion either continuously or intermittently over at least 60%, preferably 80% or more, and more preferably 100%, of the longitudinal length (i.e., the entire length)."

It may be confirmed for the following reason that the GNT has such a compressed cylindrical shape and includes a tape-shaped portion in which their inner walls are either provided close to each other or bonded together. Specifically, this is because when a fullerene-inserted GNT, obtained, for example, by hermetically sealing a GNT and a fullerene (C60) into a quartz tube and subjecting them to heating treatment under a reduced pressure (i.e., a fullerene insertion treatment), is observed through a transmission electron microscope (TEM), the GNT includes a portion into which the fullerene is not inserted (corresponding to the tape-shaped portion).

The sheet resistance of the electromagnetic wave absorbing layer 10 is preferably equal to or greater than 0.01 Ω/sq. and equal to or less than 100 Ω/sq. This particularly significantly increases the chances of electromagnetic waves attenuating in the electromagnetic wave absorbing layer 10.

The proportion of the carbon nanotubes to the electromagnetic wave absorbing layer 10 is set appropriately with the resistivity of the electromagnetic wave absorbing layer 10 and other factors taken into account. For example, the proportion of the carbon nanotubes to the electromagnetic wave absorbing layer 10 may be equal to or greater than 5% by mass and equal to or less than 60% by mass. This proportion is more preferably equal to or greater than 10% by mass and even more preferably equal to or greater than 20% by mass. Also, this proportion is more preferably equal to or less than 50% by mass and even more preferably equal to or less than 40% by mass.

The electromagnetic wave absorbing layer 10 may contain an amorphous carbon such as carbon black or acetylene black. In that case, the sheet resistance of the electromagnetic wave absorbing layer 10 may be adjusted by the amorphous carbon. The proportion of the amorphous carbon may be, for example, equal to or greater than 10% by mass and equal to or less than 50% by mass with respect to the electromagnetic wave absorbing layer 10.

The electromagnetic wave absorbing layer 10 may contain a cellulose nanofiber. This allows adjusting the sheet resistance of the electromagnetic wave absorbing layer 10 without impairing the structure or strength of the electromagnetic wave absorbing layer 10. The proportion of the cellulose nanofiber is equal to or greater than 5% by mass and equal to or less than 60% by mass with respect to the electromagnetic wave absorbing layer 10. Making this proportion equal to or greater than 5% by mass allows the sheet resistance of the electromagnetic wave absorbing layer 10 to be adjusted. Making this proportion equal to or less than 60% by mass reduces the chances of inhibiting the weight reduction of the electromagnetic wave absorbing layer 10.

The thickness of the electromagnetic wave absorbing layer 10 may be set appropriately according to, for example, the wavelength of electromagnetic waves to be blocked by the electromagnetic shielding laminated sheet 1. If the thickness of the electromagnetic wave absorbing layer 10 is approximately a quarter of the wavelength of the electromagnetic waves to be blocked by the electromagnetic shielding laminated sheet 1, then the electromagnetic shielding laminated sheet 1 may efficiently block the electromagnetic waves. In addition, even if the thickness of the electromagnetic wave absorbing layer 10 is regulated by the wavelength of the electromagnetic waves in this manner, setting the bulk density of the electromagnetic wave absorbing layer 10 at 997 kg/m$^3$ or less still makes it easier to reduce the weight of the electromagnetic shielding laminated sheet 1. The thickness of the electromagnetic wave absorbing layer 10 is preferably equal to or greater than 0.1 mm and equal to or less than 100 mm, more preferably equal to or greater than 0.5 mm and equal to or less than 10 mm, and even more preferably equal to or greater than 1 mm and equal to or less than 5 mm.

The electromagnetic wave absorbing layer 10 is formed by for example, freeze-drying a water dispersion containing the material of the electromagnetic wave absorbing layer 10. This makes it easier to turn the electromagnetic wave absorbing layer 10 into a porous one and decrease its bulk density.

The electromagnetic wave absorbing layer 10 may be, for example, a freeze-dried product formed by freeze-drying a water dispersion containing the carbon nanotubes and the water-soluble polymer. The water dispersion may be prepared by, for example, mixing the water-soluble polymer, the carbon nanofiber, and water. The proportion of the water to the water dispersion may be set appropriately according to the strength, bulk density, and other parameters required for the electromagnetic wave absorbing layer 10 and may be, for example, equal to or greater than 80% by weight and equal to or less than 99.9% by weight. The freeze-drying condition may be set appropriately. The electromagnetic wave absorbing layer 10 may be formed by, for example, freezing the water dispersion at a temperature equal to or higher than −80° C. and equal to or lower than −60° C. and then drying the frozen water dispersion under the condition including a temperature equal to or higher than −50° C. and equal to or lower than −40° C. and an absolute pressure equal to or higher than 5 Pa and equal to or lower than 50 Pa.

The water dispersion may be frozen by pouring the water dispersion into a vessel and covering the side and bottom surfaces of the vessel with a thermal insulator. This allows the water dispersion in the vessel to be sequentially frozen from an uppermost part thereof toward a lowermost part thereof. This makes it easier for the molecules of the water-soluble resin to be oriented in the upward/downward direction and thereby obtain an electromagnetic wave absorbing layer 10 having a porous structure in which voids elongate in the thickness direction are arranged in a honeycomb pattern.

If the matrix of the electromagnetic wave absorbing layer 10 contains a cured product of the thermosetting resin, then the electromagnetic wave absorbing layer 10 is a freeze-dried product formed by, for example, freeze-drying a water dispersion containing the carbon nanotubes, the water-soluble polymer, and the thermosetting resin. The water dispersion may be prepared by, for example, mixing an aqueous emulsion of the water-soluble polymer, the carbon nanofiber, and the thermosetting resin with water. The electromagnetic wave absorbing layer 10 may be formed as a freeze-dried product by freeze-drying this water dispersion by the same method as the above-described one. According to this method, if the thermosetting resin contains an epoxy resin, the epoxy resin preferably includes an emulsion type epoxy resin called the "aqueous epoxy resin" described above.

If the matrix of the electromagnetic wave absorbing layer 10 contains a cured product of the thermosetting resin, then the electromagnetic wave absorbing layer 10 may also be formed by impregnating the thermosetting resin into a freeze-dried product formed by, for example, freeze-drying a water dispersion containing the carbon nanotubes and the water-soluble polymer and then curing the thermosetting resin. In that case, the freeze-dried product may be formed in the same way as in a situation where an electromagnetic wave absorbing layer 10 containing no thermosetting resin is formed. When the freeze-dried product is impregnated with the thermosetting resin, a varnish containing the thermosetting resin is prepared by, for example, impregnating an organic solvent such as methyl ethyl ketone into the thermosetting resin. The freeze-dried product may be impregnated with the thermosetting resin by impregnating the freeze-dried product with this varnish. Subsequently, the organic solvent in the varnish is vaporized by drying the freeze-dried product impregnated with the varnish. Next, the thermosetting resin is cured by heating the freeze-dried product. The condition for heating the freeze-dried product may be set appropriately according to the composition of the thermosetting resin such that the curing reaction of the thermosetting resin is advanced. In this manner, the electromagnetic wave absorbing layer 10 may be formed. According to this method, if the thermosetting resin includes an epoxy resin, then the epoxy resin preferably includes an epoxy resin which is soluble in the organic solvent described above.

The electromagnetic wave absorbing layer 10 and the metal layer 30 may be directly in contact with each other as described above. Alternatively, an insulating layer 20 may be interposed between the electromagnetic wave absorbing layer 10 and the metal layer 30. The insulating layer 20 is a layer having electrical insulation properties.

If the electromagnetic shielding laminated sheet 1 includes the insulating layer 20, then the relative dielectric constant of the insulating layer 20 is preferably lower than the relative dielectric constant of the electromagnetic wave absorbing layer 10. This particularly significantly increases the chances of causing multiple reflections of the electromagnetic waves inside the electromagnetic shielding laminated sheet 1 and further attenuating the electromagnetic waves inside the electromagnetic shielding laminated sheet 1. Thus, the reflection of the electromagnetic waves by the electromagnetic shielding laminated sheet 1 is reduced particularly significantly. The ratio of the relative dielectric constant of the electromagnetic wave absorbing layer 10 at 25° C. to the relative dielectric constant of the insulating layer 20 at 25° C. is preferably equal to or greater than 1 and equal to or less than 50.

The insulating layer 20 is made of, for example, a resin with electrical insulation properties. The resin with electrical insulation properties preferably includes a fluorocarbon resin such as polytetrafluoroethylene, in particular. This makes it easier to lower the dielectric constant of the insulating layer 20.

Optionally, the insulating layer 20 may further contain a filler including resin particles and/or ceramic particles. This allows the filler to adjust the physical properties such as hardness and coefficient of linear expansion of the insulating layer 20. In this case, the insulating layer 20 may be formed by, for example, molding a mixture obtained by kneading the resin with electrical insulation properties and the filler into a sheet shape.

The insulating layer 20 may contain an adhesive such as an epoxy-resin-based adhesive. This allows the electromagnetic wave absorbing layer 10 and the metal layer 30 to be bonded together with the insulating layer 20.

The insulating layer 20 may contain silicone rubber. This reduces the chances of the insulating layer 20 impairing the flexibility of the electromagnetic shielding laminated sheet 1, thus making the electromagnetic shielding laminated sheet 1 less damageable even when the sheet 1 is flexed.

The material for the insulating layer 20 does not have to be the one described above. Alternatively, the insulating layer 20 may also contain any other appropriate resin with electrical insulation properties such as polycarbonate.

It is also preferable that the insulating layer 20 have a breakdown voltage equal to or higher than 5 V/μm. This may reduce the chances of causing dielectric breakdown to the insulating layer 20 even when the electromagnetic shielding laminated sheet 1 is used in the vicinity of a 5G base station, for example.

Having such a configuration, the electromagnetic shielding laminated sheet 1 according to this embodiment may reduce transmission and reflection of electromagnetic waves, despite its light weight, and may efficiently reduce transmission and reflection of electromagnetic waves falling within the range from the microwave band to the milli-wave band, in particular. Thus, this electromagnetic shielding laminated sheet 1 is applicable to reducing the transmission and reflection of electromagnetic waves having a frequency of 3 GHz to 10 GHz, which is a communication frequency of ultra-wideband (UWB) wireless communication in an artificial satellite, and electromagnetic waves falling within the 28 GHz band and 39 GHz band, which are frequencies around the communication frequency of the 5G communication. In these cases, the attenuation in a situation where the electromagnetic waves are transmitted through the electromagnetic shielding laminated sheet 1 and the attenuation in a situation where the electromagnetic waves are reflected from the electromagnetic shielding laminated sheet 1 may be reduced to −10 dB or less, or even −20 dB or less.

For example, the electromagnetic shielding laminated sheet 1 may be applied to the field of artificial satellites as a shield against the noise generated from a wireless power feeding coil or to control a signal wave transmission path when communication between electronic devices is established wirelessly, not via cables, in order to reduce the weight.

EXAMPLES

Next, specific examples of this embodiment will be presented. Not that the examples to be described below are only examples of this embodiment and should not be construed as limiting.

1. Formation of Electromagnetic Wave Absorbing Layer (Examples 1-16)

To a mixture obtained by adding the materials shown in the following Tables 1-4 to distilled water, ultrasonic waves were applied from an ultrasonic horn three times at an output of 135 W for three minutes each time, thereby preparing a water dispersion having a solid content of 5% by mass. This water dispersion was poured into a mold, of which the dimensions included 180 mm×180 mm in plan view and a depth of 10 mm, and then cooled in a refrigerator at −80° C. for two hours. In this manner, the water dispersion was frozen. Subsequently, the water dispersion thus frozen (hereinafter referred to as a "frozen product") is freeze-dried using a freeze-dryer. In this case, the absolute pressure of the atmosphere surrounding the frozen product was adjusted to fall within the range from 10 Pa to 20 Pa, the temperature thereof was adjusted to fall within the range from −45° C. to −50° C., and a cold trap temperature was set at −45° C., thereby drying the frozen product over 24 hours. Subsequently, in Examples 13-16, to cure the epoxy resin in the resin composition A, the frozen product was further heated at 80° C. for three hours. In this manner, an electromagnetic wave absorbing layer was formed. Then, the electromagnetic wave absorbing layer thus formed was removed from the mold.

2. Formation of Electromagnetic Wave Absorbing Layer (Examples 17-20)

Figure 2:
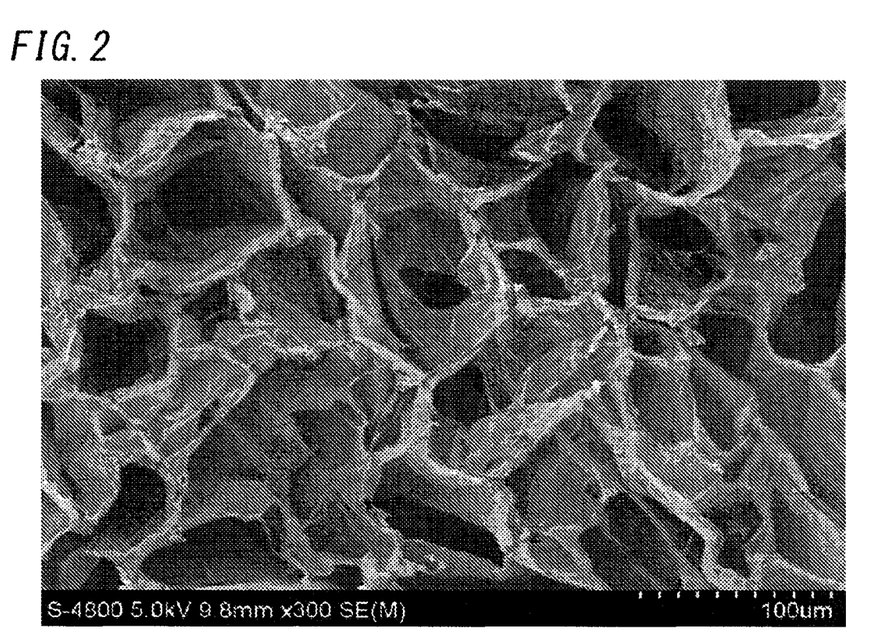
FIG. 2 is a photograph shot by observing an electromagnetic wave absorbing layer according to Example 2 through a scanning electron microscope.

A base member having the same structure as the electromagnetic wave absorbing layer according to Example 2 was formed under the same forming condition as the electromagnetic wave absorbing layer according to Example 2.

The base member was immersed in, and thereby impregnated with, a varnish, which had been obtained by diluting the resin composition B with methyl ethyl ketone. Subsequently, the base member impregnated with the varnish was heated at 100° C. for 30 minutes to be dried and then heated at 180° C. for two hours to be cured, thereby forming an electromagnetic wave absorbing layer. Note that the ratio of the materials shown in Table 5 is the ratio by mass of the base member materials used to form the electromagnetic wave absorbing layer to the resin composition B.

The following are the details of the materials shown in the tables:

Single-layer carbon nanotube 1: product name ZEO NANO® SG101 manufactured by Zeon Nanotechnology Co., Ltd., having a BET specific surface area of 1,050 m²/g, a G/D ratio of 3.7, an average diameter (Av) of 3.3 nm, which was obtained based on the results of measuring, through a transmission electron microscope, the diameters of particles of 100 single-layer carbon nanotubes 1 that were picked at random, and a convex up t-plot obtained from an adsorption isotherm;

Single-layer carbon nanotube 2: product number EC 2.0 manufactured by Meijo Nano Carbon, having a BET specific surface area of 500 m²/g, a G/D ratio of 37, and an average diameter (Av) of 2.0 nm, which was obtained based on the results of measuring, through a transmission electron microscope, the diameters of particles of 100 single-layer carbon nanotubes 2 that were picked at random;

Cellulose nanofiber: product name Rheocrysta I-2SX manufactured by DKS Co., Ltd.;

Sodium carboxymethyl cellulose manufactured by FUJI-FILM Wako Pure Chemical Corporation;

Acetylene black: product name Denka black manufactured by Denka Co. Ltd.;

Resin composition A: a mixture in which an aqueous epoxy resin (product name 1155R55) manufactured by Mitsubishi Chemical Corporation and a curing agent for aqueous epoxy resins (product name WD11M60) manufactured by Mitsubishi Chemical Corporation are mixed at a ratio by mass of 100 to 53; and Resin composition B: a mixture in which a brominated bisphenol A epoxy resin dissolved in methyl ethyl ketone (product name 153-60M) manufactured by DIC Corporation and an epoxy curing agent (product name dicyandiamide) manufactured by Nippon Carbide Industries Co., Inc. are mixed at a ratio by mass of 100 to 3.

The bulk density, volume resistivity in the thickness direction, sheet resistance, and relative dielectric constant of the electromagnetic wave absorbing layer are also shown in the following tables.

Note that the bulk density was calculated based on the result of measurement of the external dimensions of the electromagnetic wave absorbing layer and the result of measurement of the mass of the electromagnetic wave absorbing layer.

When the volume resistivity in the thickness direction and the sheet resistance were measured for an electromagnetic wave absorbing layer having a resistance value equal to or greater than $10^4$ Ω and equal to or less than $10^{13}$Ω, the resistance value (Ω) at room temperature was measured using a high resistivity meter by double ring method (Hiresta® MCP-HT800 manufactured by Mitsubishi Chemical Analytics with URS probe used as a probe) in compliance with the JIS K 6911 standard. On the other hand, when the electromagnetic wave absorbing layer had a resistance value equal to or greater than $10^{-2}$Ω and less than $10^4$ Ω, the resistance value (Ω) at room temperature was measured using a low resistivity meter by the four-probe method (Loresta® MCP-610T manufactured by Mitsubishi Chemical Analytics with ASP probe used as a probe) in compliance with the JIS K 7194 standard. Also, when the measurements were carried out, three 100 mm×100 mm square test pieces were cut as measurement samples out of the electromagnetic wave absorbing layer and the resistance value (Ω) was measured with a probe pressed against a center position of each of the three measurement samples. The resistance values (Ω) of the three measurement samples were measured and the average value thereof was regarded as the resistance value (Ω) of the electromagnetic wave absorbing material. Based on the resistance value (Ω) thus obtained and the dimensions of the samples, the volume resistivity (Ω·cm) and the sheet resistance (Ω/sq.) were calculated by ordinary methods.

The relative dielectric constant was measured by coaxial tube method.

2. Formation of Electromagnetic Shielding Laminated Sheet

An electromagnetic shielding laminated sheet was formed by stacking either the electromagnetic wave absorbing layer and the metal layer or the electromagnetic wave absorbing layer, the insulating layer, and the metal layer in the combinations shown in the following Tables 1-5.

Note that the volume resistivity in the thickness direction and sheet resistance of each of the insulating layer and the metal layer and the relative dielectric constant of the insulating layer were measured by the same methods as in the case of the electromagnetic wave absorbing layer.

3. Evaluation Tests (1) Density

The results of measurement of the density of the electromagnetic shielding laminated sheet are also shown in the following tables.

(2) Flexibility

The electromagnetic shielding laminated sheet was subjected to a 180-degree bending test by the cylindrical mandrel method using a mandrel with a radius of 10 mm. As a result, an electromagnetic shielding laminated sheet that could be wound around the mandrel with no damage caused was evaluated to be a "GO." On the other hand, an electromagnetic shielding laminated sheet that could be wound around the mandrel with some damage caused and an electromagnetic shielding laminated sheet that could not be wound around the mandrel were each evaluated to be a "NO-GO."

(3) Water Resistance

The electromagnetic shielding laminated sheet was soaked in purified water at 23° C.±5° C. for 30 minutes and then picked out of the water. As a result, an electromagnetic shielding laminated sheet that was neither dissolved nor damaged was evaluated to be a "GO." On the other hand, an electromagnetic shielding laminated sheet that was dissolved and/or damaged was evaluated to be a "NO-GO."

(4) Moisture Resistance

The electromagnetic shielding laminated sheet was put into a stainless-steel container with a flat bottom such that the electromagnetic wave absorbing layer thereof was in contact with the bottom of the container. The container containing the electromagnetic shielding laminated sheet was left for 500 hours in a vessel, of which the temperature and humidity were kept constant at 85° C. and 85% RH, respectively. Subsequently, the container was unloaded from the vessel. An electromagnetic shielding laminated sheet which was not damaged when lifted from the bottom of the stainless-steel container was evaluated to be a "GO." On the other hand, an electromagnetic shielding laminated sheet which stuck to the bottom of the container and was damaged when lifted from the container was evaluated to be a "NO-GO."

(5) Reflected Wave Attenuation Characteristic

A test piece was formed by fixing the electromagnetic shielding laminated sheet onto a jig made of an acrylic resin. Meanwhile, a reference was also formed by fixing only the metal layer thereof onto a jig made of an acrylic resin.

The S (scattering) parameter ($S21_{sample}$) at two ports of the test piece was measured by the free space method with respect to an electromagnetic wave having a frequency of 1-18 GHz. As a measurement system, a vector network analyzer (8720ES manufactured by Agilent Technologies), a transmission antenna (BBHA 9120-B manufactured by Schwarzbeck-Mess-Elecktronik), and a reception antenna (BBHA 9120-B manufactured by Schwarzbeck-Mess-Elecktronik and having the same product number as the transmission antenna) were adopted. At the time of the measurement, a horizontally polarized electromagnetic wave that had been emitted from the transmission antenna was allowed to be incident on the test piece at an angle of incidence of 45 degrees, and a reflected wave reflected in a direction forming an angle of 90 degrees with respect to the direction of incidence was received at the reception antenna.

The S (scattering) parameter ($S21_{reference}$) at two ports of the reference was also measured in the same way.

The difference between the measured value of the reference and the measured value of the test piece was regarded as the reflective wave attenuation caused by the electromagnetic shielding laminated sheet. The reflective wave attenuation (dB) caused by the electromagnetic shielding laminated sheet was calculated by the following Equation (1):

$$\text{Reflected wave attenuation(dB)} = 20\ \log|S21_{sample}| - 20\ \log|S21_{reference}| \quad (1)$$

The frequency indicating the peak of the reflected wave attenuation within the frequency range of 1 GHz to 18 GHz and its corresponding attenuation are also shown in the following tables:

TABLE 1

| | | | Ex. 1 | Ex. 2 | Ex. 3 | Ex. 4 |
|---|---|---|---|---|---|---|
| Electromagnetic wave absorbing layer | Materials/ % by mass | Single-layer carbon nanotube 1 | 25 | 40 | 40 | 40 |
| | | Single-layer carbon nanotube 2 | 6 | | | |
| | | Cellulose nanofiber | | | | |
| | | Sodium carboxymethyl cellulose | 38 | 60 | 60 | 60 |
| | | Acetylene black | 31 | | | |
| | | Resin composition A | | | | |
| | | Resin composition B | | | | |
| | Thickness [mm] | | 5.0 | 5.0 | 3.0 | 1.0 |
| | Bulk density [mg/cm³] | | 16 | 10 | 10 | 10 |
| | Volume resistivity [Ω · cm] | | 1.5 | 2.8 | 2.8 | 2.8 |
| | Sheet resistance [Ω/sq.] | | 2.0 | 4.2 | 7.0 | 21.0 |
| | Relative dielectric constant (1 GHz) | | 14.8 | 8.6 | 8.6 | 8.6 |
| Insulating layer | Material | | — | — | — | — |
| | Thickness [mm] | | — | — | — | — |
| | Volume resistivity [Ω · cm] | | — | — | — | — |
| | Sheet resistance [Ω/sq.] | | — | — | — | — |
| | Relative dielectric constant (1 GHz) | | — | — | — | — |
| Metal layer | Material | | Al | Al | Al | Al |
| | Thickness [mm] | | 0.010 | 0.010 | 0.010 | 0.010 |
| | Volume resistivity [Ω · cm] | | ≤$10^{-6}$ | ≤$10^{-6}$ | ≤$10^{-6}$ | ≤$10^{-6}$ |
| | Sheet resistance [Ω/sq.] | | ≤$10^{-3}$ | ≤$10^{-3}$ | ≤$10^{-3}$ | ≤$10^{-3}$ |
| Evaluation | Density [mg/cm³] | | 21.36 | 15.37 | 15.37 | 15.37 |
| | Flexibility (R = 10 mm bending) | | GO | GO | GO | GO |
| | Water resistance | | NO-GO | NO-GO | NO-GO | NO-GO |
| | Moisture resistance | | NO-GO | NO-GO | NO-GO | NO-GO |
| | Reflected wave attenuation characteristic (frequency indicating peak of reflected wave attenuation and corresponding attenuation) | | 5.5 GHz; −12.4 dB 13.6 GHz; −17.1 dB 15.2 GHz; −20.1 dB | 5.6 GHz; −9.7 dB 9.1 GHz; −13.5 dB | 5.1 GHz; −16.1 dB 10.4 GHz; −10.2 dB | 6.7 GHz; −18.6 dB |

TABLE 2

| | | | Ex. 5 | Ex. 6 | Ex. 7 | Ex. 8 |
|---|---|---|---|---|---|---|
| Electromagnetic wave absorbing layer | Materials/ % by mass | Single-layer carbon nanotube 1 | 20 | 10 | 5 | 5 |
| | | Single-layer carbon nanotube 2 | | | | |
| | | Cellulose nanofiber | 20 | 30 | 35 | 35 |
| | | Sodium carboxymethyl cellulose | 60 | 60 | 60 | 60 |
| | | Acetylene black | | | | |
| | | Resin composition A | | | | |
| | | Resin composition B | | | | |
| | Thickness [mm] | | 5.0 | 5.0 | 5.0 | 3.0 |
| | Bulk density [mg/cm³] | | 10 | 10 | 10 | 10 |
| | Volume resistivity [Ω · cm] | | 18 | 135 | 2.454 | 2.454 |
| | Sheet resistance [Ω/sq.] | | 27 | 218 | 4.294 | 7.157 |
| | Relative dielectric constant (1 GHz) | | 13.2 | 6.5 | 4.8 | 4.8 |
| Insulating | Material | | — | — | — | — |

TABLE 2-continued

|  |  | Ex. 5 | Ex. 6 | Ex. 7 | Ex. 8 |
|---|---|---|---|---|---|
| layer | Thickness [mm] | — | — | — | — |
|  | Volume resistivity [Ω·cm] | — | — | — | — |
|  | Sheet resistance [Ω/sq.] | — | — | — | — |
|  | Relative dielectric constant (1 GHz) | — | — | — | — |
| Metal layer | Material | Al | Al | Al | Al |
|  | Thickness [mm] | 0.010 | 0.010 | 0.010 | 0.010 |
|  | Volume resistivity [Ω·cm] | ≤$10^{-6}$ | ≤$10^{-6}$ | ≤$10^{-6}$ | ≤$10^{-6}$ |
|  | Sheet resistance [Ω/sq.] | ≤$10^{-3}$ | ≤$10^{-3}$ | ≤$10^{-3}$ | ≤$10^{-3}$ |
| Evaluation | Density [mg/cm³] | 15.37 | 15.37 | 15.37 | 15.37 |
|  | Flexibility (R = 10 mm bending) | GO | GO | GO | GO |
|  | Water resistance | NO-GO | NO-GO | NO-GO | NO-GO |
|  | Moisture resistance | NO-GO | NO-GO | NO-GO | NO-GO |
|  | Reflected wave attenuation characteristic (frequency indicating peak of reflected wave attenuation and corresponding attenuation) | 5.8 GHz; −12.5 dB 9.1 GHz; −10.3 dB 14.2 GHz; −10.8 dB | 4.9 GHz; −15.7 dB 9.0 GHz; −17.0 dB | 6.1 GHz; −19.0 dB 10.5 GHz; −20.6 dB | 8.1 GHz; −23.8 dB 9.4 GHz; −20.9 dB 10.4 GHz; −21.9 dB 11.8 GHz; −23.1 dB 14.7 GHz; −21.6 dB |

TABLE 3

|  |  |  | Ex. 9 | Ex. 10 | Ex. 11 | Ex. 12 | Cmp.Ex.1 |
|---|---|---|---|---|---|---|---|
| Electromagnetic wave absorbing layer | Materials/ % by mass | Single-layer carbon nanotube 1 | 5 | 5 | 5 | 5 |  |
|  |  | Single-layer carbon nanotube 2 |  |  |  |  |  |
|  |  | Cellulose nanofiber | 35 | 35 | 35 | 35 | 40 |
|  |  | Sodium carboxymethyl cellulose | 60 | 60 | 60 | 60 | 60 |
|  |  | Acetylene black |  |  |  |  |  |
|  |  | Resin composition A |  |  |  |  |  |
|  |  | Resin composition B |  |  |  |  |  |
|  | Thickness [mm] |  | 1.0 | 3.0 | 3.0 | 3.0 | 5.0 |
|  | Bulk density [mg/cm³] |  | 10 | 10 | 10 | 10 | 10 |
|  | Volume resistivity [Ω·cm] |  | 2.454 | 2.454 | 2.454 | 2.454 | Insulating |
|  | Sheet resistance [Ω/sq.] |  | 21.470 | 7.157 | 7.157 | 7.157 | Insulating |
|  | Relative dielectric constant (1 GHz) |  | 4.8 | 4.8 | 4.8 | 4.8 | 1.6 |
| Insulating layer | Material |  | — | polycarbonate | PTFE | silicone rubber | — |
|  | Thickness [mm] |  | — | 2.0 mm | 1.0 mm | 1.0 mm | — |
|  | Volume resistivity [Ω·cm] |  | — | ≥$10^8$ | ≥$10^8$ | ≥$10^8$ | — |
|  | Sheet resistance [Ω/sq.] |  | — | ≥5 × $10^8$ | ≥5 × $10^8$ | ≥5 × $10^8$ | — |
|  | Relative dielectric constant (1 GHz) |  | — | 3.1 | 2.1 | 2.8 | — |
| Metal layer | Material |  | Al | Al | Al | Al | Al |
|  | Thickness [mm] |  | 0.010 | 0.010 | 0.010 | 0.010 | 0.010 |
|  | Volume resistivity [Ω·cm] |  | ≤$10^{-6}$ | ≤$10^{-6}$ | ≤$10^{-6}$ | ≤$10^{-6}$ | ≤$10^{-6}$ |
|  | Sheet resistance [Ω/sq.] |  | ≤$10^{-3}$ | ≤$10^{-3}$ | ≤$10^{-3}$ | ≤$10^{-3}$ | ≤$10^{-3}$ |
| Evaluation | Density [mg/cm³] |  | 15.37 | 99.04 | 149.70 | 71.75 | 15.37 |
|  | Flexibility (R = 10 mm bending) |  | GO | NO-GO | NO-GO | GO | GO |
|  | Water resistance |  | NO-GO | NO-GO | NO-GO | NO-GO | NO-GO |
|  | Moisture resistance |  | NO-GO | NO-GO | NO-GO | NO-GO | NO-GO |
|  | Reflected wave attenuation characteristic (frequency indicating peak of reflected wave attenuation and corresponding attenuation) |  | 6.6 GHz; −6.6 dB 15.6 Hz; −10.0 dB | 5.9 GHz; −11.4 dB 7.9 GHz; −21.6 dB | 6.5 GHz; −18.6 dB 8.1 GHz; −19.6 dB 10.6 GHz; −24.5 dB 12.1 GHz; −19.4 dB 14.9 GHz; −16.0 dB | 6.2 GHz; −17.6 dB 8.1 GHz; −13.4 dB 9.1 GHz; −19.7 dB 10.4 GHz; −25.5 dB 11.9 GHz; −17.8 dB 14.7 GHz; −14.0 dB | 6.8 GHz; −11.6 dB |

TABLE 4

|  |  |  | Ex. 13 | Ex. 14 | Ex. 15 | Ex. 16 |
|---|---|---|---|---|---|---|
| Electromagnetic wave absorbing layer | Materials/ % by mass | Single-layer carbon nanotube 1 | 27 | 20 | 13 | 10 |
|  |  | Single-layer carbon nanotube 2 |  |  |  |  |
|  |  | Cellulose nanofiber |  |  |  |  |
|  |  | Sodium carboxymethyl cellulose | 40 | 30 | 20 | 15 |
|  |  | Acetylene black |  |  |  |  |
|  |  | Resin composition A | 33 | 50 | 67 | 75 |
|  |  | Resin composition B |  |  |  |  |
|  | Thickness [mm] |  | 5.0 | 5.0 | 5.0 | 5.0 |
|  | Bulk density [mg/cm$^3$] |  | 15 | 20 | 30 | 40 |
|  | Volume resistivity [Ω · cm] |  | 3.1 | 3.2 | 3.3 | 3.5 |
|  | Sheet resistance [Ω/sq.] |  | 6.2 | 6.3 | 6.6 | 7.0 |
|  | Relative dielectric constant (1 GHz) |  | 8.6 | 8.5 | 8.5 | 8.4 |
| Insulating layer | Material |  | — | — | — | — |
|  | Thickness [mm] |  | — | — | — | — |
|  | Volume resistivity [Ω · cm] |  | — | — | — | — |
|  | Sheet resistance [Ω/sq.] |  | — | — | — | — |
|  | Relative dielectric constant (1 GHz) |  | — | — | — | — |
| Metal layer | Material |  | Al | Al | Al | Al |
|  | Thickness [mm] |  | 0.010 | 0.010 | 0.010 | 0.010 |
|  | Volume resistivity [Ω · cm] |  | ≤10$^{-6}$ | ≤10$^{-6}$ | ≤10$^{-6}$ | ≤10$^{-6}$ |
|  | Sheet resistance [Ω/sq.] |  | ≤10$^{-3}$ | ≤10$^{-3}$ | ≤10$^{-3}$ | ≤10$^{-3}$ |
| Evaluation | Density [mg/cm$^3$] |  | 20.36 | 25.35 | 35.33 | 45.31 |
|  | Flexibility (R = 10 mm bending) |  | GO | GO | GO | GO |
|  | Water resistance |  | NO-GO | GO | GO | GO |
|  | Moisture resistance |  | NO-GO | GO | GO | GO |
|  | Reflected wave attenuation characteristic (frequency indicating peak of reflected wave attenuation and corresponding attenuation) |  | 5.6 GHz; −9.7 dB 9.1 GHz; −13.4 dB | 5.6 GHz; −9.5 dB 9.1 GHz; −13.2 dB | 5.6 GHz; −9.6 dB 9.1 GHz; −13.3 dB | 5.6 GHz; −9.3 dB 9.1 GHz; −13.0 dB |

TABLE 5

|  |  |  | Ex. 17 | Ex. 18 | Ex. 19 | Ex. 20 |
|---|---|---|---|---|---|---|
| Electromagnetic wave absorbing layer | Materials/ % by mass | Single-layer carbon nanotube 1 | 33.3 | 20 | 10 | 4 |
|  |  | Single-layer carbon nanotube 2 |  |  |  |  |
|  |  | Cellulose nanofiber |  |  |  |  |
|  |  | Sodium carboxymethyl cellulose | 50 | 30 | 15 | 6 |
|  |  | Acetylene black |  |  |  |  |
|  |  | Resin composition A |  |  |  |  |
|  |  | Resin composition B | 16.7 | 50 | 75 | 90 |
|  | Thickness [mm] |  | 5.0 | 5.0 | 5.0 | 5.0 |
|  | Bulk density [mg/cm$^3$] |  | 12 | 20 | 40 | 100 |
|  | Volume resistivity [Ω · cm] |  | 3.0 | 3.1 | 3.4 | 4.3 |
|  | Sheet resistance [Ω/sq.] |  | 6.0 | 6.3 | 6.9 | 8.7 |
|  | Relative dielectric constant (1 GHz) |  | 8.6 | 8.5 | 8.4 | 8.0 |
| Insulating layer | Material |  | — | — | — | — |
|  | Thickness [mm] |  | — | — | — | — |
|  | Volume resistivity [Ω · cm] |  | — | — | — | — |
|  | Sheet resistance [Ω/sq.] |  | — | — | — | — |
|  | Relative dielectric constant (1 GHz) |  | — | — | — | — |
| Metal layer | Material |  | Al | Al | Al | Al |
|  | Thickness [mm] |  | 0.010 | 0.010 | 0.010 | 0.010 |
|  | Volume resistivity [Ω · cm] |  | ≤10$^{-6}$ | ≤10$^{-6}$ | ≤10$^{-6}$ | ≤10$^{-6}$ |
|  | Sheet resistance [Ω/sq.] |  | ≤10$^{-3}$ | ≤10$^{-3}$ | ≤10$^{-3}$ | ≤10$^{-3}$ |
| Evaluation | Density [mg/cm$^3$] |  | 17.37 | 25.35 | 45.31 | 105.19 |
|  | Flexibility (R = 10 mm bending) |  | GO | NO-GO | NO-GO | NO-GO |
|  | Water resistance |  | GO | GO | GO | GO |
|  | Moisture resistance |  | GO | GO | GO | GO |
|  | Reflected wave attenuation characteristic (frequency indicating peak of reflected wave attenuation and corresponding attenuation) |  | 5.6 GHz; −9.7 dB 9.1 GHz; −13.4 dB | 5.6 GHz; −9.6 dB 9.1 GHz; −13.2 dB | 5.6 GHz; −9.2 dB 9.1 GHz; −13.0 dB | 5.6 GHz; −8.8 dB 9.1 GHz; −12.5 dB |

The invention claimed is:

1. An electromagnetic shielding laminated sheet comprising: an electromagnetic wave absorbing layer including a matrix and carbon nanotubes dispersed in the matrix, the electromagnetic wave absorbing layer having a bulk density equal to or less than 100 kg/m$^3$; and a metal layer laid on top of the electromagnetic wave absorbing layer, wherein a proportion of the carbon nanotubes to the electromagnetic wave absorbing layer is equal to or greater than 5% by mass and equal to or less than 60% by mass, wherein the matrix contains a water-soluble polymer and a cured product of a thermosetting resin, wherein the electromagnetic absorbing layer is a freeze-dried product formed by freeze-drying a water dispersion containing the carbon nanotubes and the water-soluble polymer, and wherein the thermosetting resin is contained by the water dispersion or is impregnated into the freeze-dried product.

2. The electromagnetic shielding laminated sheet of claim 1, further comprising an insulating layer interposed between the electromagnetic wave absorbing layer and the metal layer.

3. The electromagnetic shielding laminated sheet of claim 2, wherein a relative dielectric constant of the insulating layer is lower than a relative dielectric constant of the electromagnetic wave absorbing layer.

4. The electromagnetic shielding laminated sheet of claim 3, wherein the electromagnetic wave absorbing layer is porous.

5. The electromagnetic shielding laminated sheet of claim 2, wherein the electromagnetic wave absorbing layer is porous.

6. The electromagnetic shielding laminated sheet of claim 1, wherein the electromagnetic wave absorbing layer is porous.

7. The electromagnetic shielding laminated sheet of claim 1, wherein a proportion of the thermosetting resin to the electromagnetic wave absorbing layer is equal to or greater than 5% by mass and equal to or less than 90% by mass.

8. The electromagnetic shielding laminated sheet of claim 1, wherein the electromagnetic wave absorbing layer comprises cellulose nanofibers.

9. The electromagnetic shielding laminated sheet of claim 1, wherein the electromagnetic wave absorbing layer having the bulk density equal to or less than 40 kg/m$^3$.

\* \* \* \* \*